(12) United States Patent
Ohashi

(10) Patent No.: US 7,320,917 B2
(45) Date of Patent: Jan. 22, 2008

(54) SEMICONDUCTOR DEVICE AND METHOD FOR MANUFACTURING THE SAME

(75) Inventor: Hideaki Ohashi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 211 days.

(21) Appl. No.: 10/274,876

(22) Filed: Oct. 22, 2002

(65) Prior Publication Data
US 2003/0183898 A1 Oct. 2, 2003

(30) Foreign Application Priority Data
Mar. 26, 2002 (JP) ............................. 2002-086439

(51) Int. Cl.
*H01L 21/00* (2006.01)
(52) U.S. Cl. .................. 438/278; 438/287; 438/197
(58) Field of Classification Search ............. 438/278, 438/287, 197
See application file for complete search history.

(56) References Cited

U.S. PATENT DOCUMENTS

| | | | | |
|---|---|---|---|---|
| 5,242,850 | A * | 9/1993 | Tasaka | 438/278 |
| 5,404,046 | A * | 4/1995 | Matsumoto et al. | 257/750 |
| 6,013,584 | A | 1/2000 | M'Saad | |
| 6,235,619 | B1 * | 5/2001 | Miyakawa | 438/585 |
| 6,245,661 | B1 * | 6/2001 | Matsumoto et al. | 438/622 |
| 6,268,297 | B1 * | 7/2001 | Nag et al. | 438/783 |
| 6,355,547 | B1 | 3/2002 | Lee | |
| 6,462,375 | B1 * | 10/2002 | Wu | 257/316 |
| 6,525,369 | B1 * | 2/2003 | Wu | 257/315 |
| 6,528,843 | B1 * | 3/2003 | Wu | 257/315 |
| 6,531,718 | B2 * | 3/2003 | Inoue et al. | 257/189 |
| 6,531,734 | B1 * | 3/2003 | Wu | 257/315 |
| 6,534,840 | B2 * | 3/2003 | Esaki | 257/499 |
| 6,613,697 | B1 * | 9/2003 | Faur et al. | 438/770 |
| 6,649,462 | B2 * | 11/2003 | Azuma et al. | 438/231 |
| 6,690,058 | B2 * | 2/2004 | Wu | 257/316 |
| 6,690,060 | B2 * | 2/2004 | Horiuchi et al. | 257/327 |
| 6,690,071 | B2 * | 2/2004 | Sambonsugi et al. | 257/376 |
| 6,710,396 | B1 * | 3/2004 | Wu | 257/315 |
| 6,737,683 | B2 * | 5/2004 | Inoue et al. | 257/192 |

(Continued)

FOREIGN PATENT DOCUMENTS

CN 1264171 A 8/2000

(Continued)

OTHER PUBLICATIONS

Chinese Patent Office Action (with English language translation) dated Apr. 12, 2004.

(Continued)

*Primary Examiner*—Laura M. Schillinger
(74) *Attorney, Agent, or Firm*—Westerman, Hattori, Daniels & Adrian, LLP.

(57) ABSTRACT

Gate length is 110 nm±15 nm or shorter (130 nm or shorter in a design rule) or an aspect ratio of an area between adjacent gate electrode structures thereof (ratio of the height of the gate electrode structure to the distance between the gate electrode structures) is 6 or higher. A PSG (HDP-PSG: Phospho Silicate Glass) film containing a conductive impurity is formed as an interlayer insulating film for burying the gate electrode structures at film-formation temperature of 650° C. or lower by a high-density plasma CVD (HDP-CVD) method.

35 Claims, 12 Drawing Sheets

U.S. PATENT DOCUMENTS

| | | | |
|---|---|---|---|
| 6,770,922 B2* | 8/2004 | Inoue et al. | 257/289 |
| 6,800,909 B2* | 10/2004 | Sugiyama et al. | 257/408 |
| 7,087,474 B2* | 8/2006 | Mitsuda et al. | 438/197 |
| 7,105,394 B2* | 9/2006 | Hachimine et al. | 438/197 |
| 7,109,128 B2* | 9/2006 | Sugiyama et al. | 438/745 |
| 7,135,393 B2* | 11/2006 | Tagawa | 438/519 |
| 2003/0067045 A1* | 4/2003 | Sugiyama et al. | 257/408 |
| 2003/0102516 A1* | 6/2003 | Sambonsugi et al. | 257/393 |
| 2003/0181005 A1* | 9/2003 | Hachimine et al. | 438/231 |
| 2003/0183898 A1* | 10/2003 | Ohashi | 257/499 |
| 2003/0193064 A1* | 10/2003 | Wu | 257/315 |
| 2004/0132249 A1* | 7/2004 | Mitsuda et al. | 438/260 |
| 2004/0224517 A1* | 11/2004 | Sugiyama et al. | 438/689 |
| 2005/0191831 A1* | 9/2005 | Tagawa | 438/519 |
| 2005/0227440 A1* | 10/2005 | Ema et al. | 438/275 |
| 2005/0285203 A1* | 12/2005 | Fukutome et al. | 257/368 |
| 2006/0006420 A1* | 1/2006 | Goto | 257/204 |
| 2006/0046493 A1* | 3/2006 | Kokura | 438/705 |
| 2006/0157776 A1* | 7/2006 | Chang et al. | 257/324 |
| 2006/0170046 A1* | 8/2006 | Hara | 257/347 |
| 2006/0172498 A1* | 8/2006 | Yamaguchi et al. | 438/287 |
| 2006/0186557 A1* | 8/2006 | Shima et al. | 257/900 |
| 2006/0199323 A1* | 9/2006 | Mitsuda et al. | 438/197 |
| 2006/0220113 A1* | 10/2006 | Tamura et al. | 257/335 |
| 2006/0292820 A1* | 12/2006 | Lee | 438/424 |
| 2007/0007246 A1* | 1/2007 | Idani | 216/88 |

FOREIGN PATENT DOCUMENTS

| | | |
|---|---|---|
| CN | 1270935 A | 10/2000 |
| JP | 08-115911 | 5/1996 |
| JP | 11-61409 | 3/1999 |
| JP | 11-317409 | 11/1999 |
| JP | 2002-043311 | 2/2002 |

OTHER PUBLICATIONS

Patent Abstract of Japan, Publication No. 2000183152 A dated Jun. 30, 2000.

Japanese Office Action dated Mar. 6, 2007 (mailing date), issued in corresponding Japanese Patent Application No. 2002-086439.

Prior Art Information List. 2007.

* cited by examiner

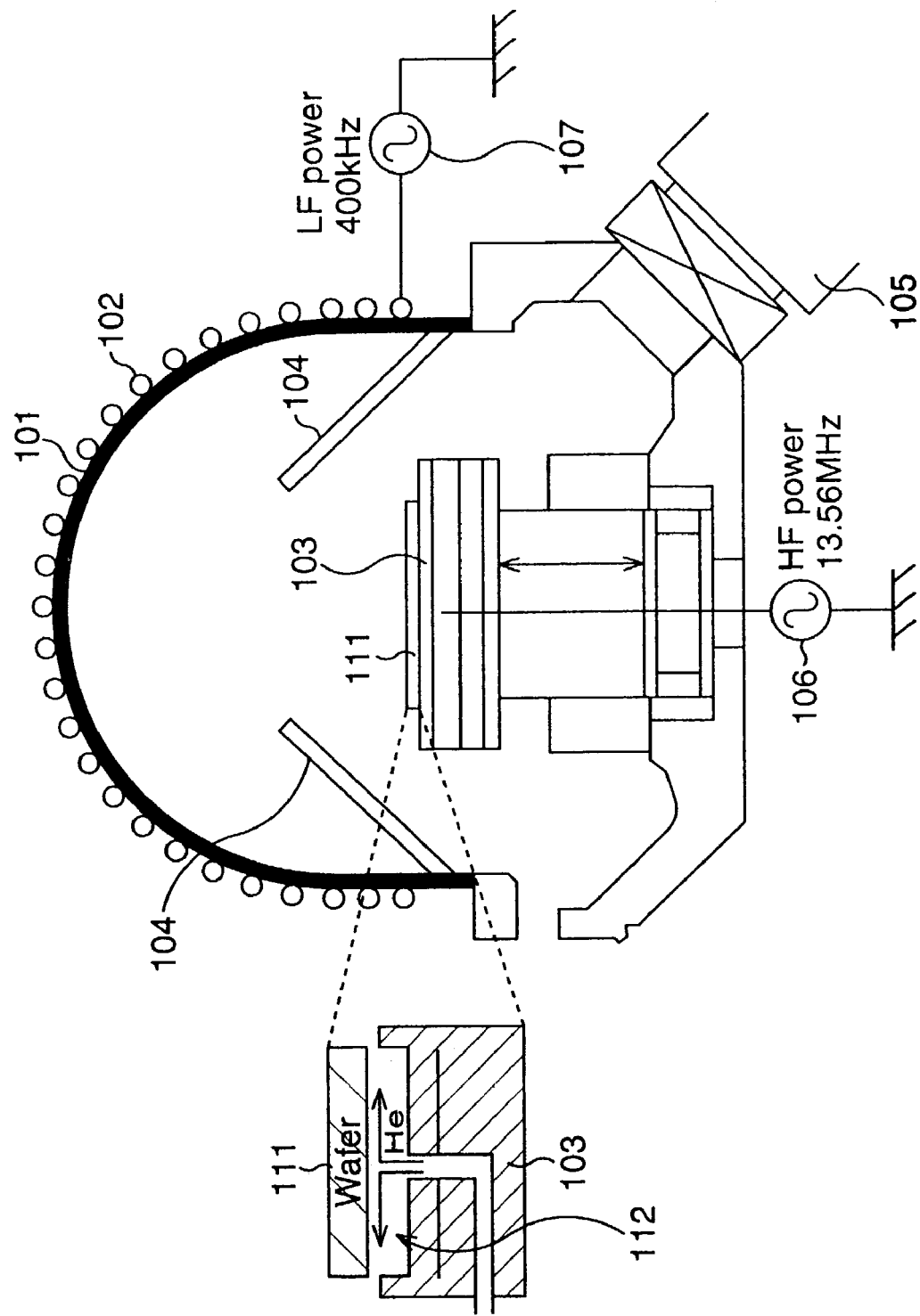

SEMICONDUCTOR DEVICE AND METHOD FOR MANUFACTURING THE SAME

CROSS-REFERENCE TO RELATED APPLICATIONS

This application is based upon and claims priority of Japanese Patent Application No. 2002-086439, filed on Mar. 26, 2002, the contents being incorporated herein by reference.

BACKGROUND OF THE INVENTION

1. Field of the Invention

The present invention relates to a semiconductor device in which a gate electrode is formed on a semiconductor substrate and a method for manufacturing the same, and is preferable to be applied to a fine semiconductor device having high aspect ratio of an area between the gate electrodes and in which a gate length is shortened.

2. Description of the Related Art

Recently, a finer semiconductor device with higher-density design is increasingly demanded and the gate length and the distance between gate electrodes are being further shortened in a DRAM and logic combined type device or a logic device. As a result, it is difficult to obtain excellent ability of filling the area between the gate electrodes when an ordinary silicon oxide film is used as an interlayer insulating film, and a BPSG (Boro-Phospho Silicate Glass) film or a USG (HDP-USG: High Density Plasma-CVD—Undoped Silicate Glass) film by a high-density plasma CVD method are becoming used alternatively.

The BPSG film covers the gate electrode and has a characteristic that it has a high etching selection ratio with a silicon nitride film, which works as an etching stopper in forming a contact hole. If this BPSG film is used as the interlayer insulating film, it is possible to sufficiently respond to a SAC (Self Align Contact) technique applied according to the shortened gate length and distance between the gate electrodes.

In filling the shortened area between the gate electrodes with the BPSG film, a so-called slit void occurs at the film-formation. If a contact hole is formed between the gate electrodes, adjacent contact holes make a short circuit due to the slit void, and therefore it is necessary to eliminate the slit void by melting, reflowing, and annealing the BPSG film.

In the semiconductor device with the shortened area between the gate electrodes, if thermal treatment at the high temperature is performed in a manufacturing process thereof, an impurity doped to the semiconductor substrate diffuses up to a gate insulating film in forming a source/drain, which results in characteristic change in a threshold voltage. Further, due to the thermal treatment at the high temperature, an impurity introduced to lower the resistance of the gate electrode, which consists of polycrystalline silicon, boron (B) for example, penetrates the gate insulating film and diffuses to the source/drain (so-called boron penetration). In order to avoid these disadvantages, it is essential to control the treatment temperature of the manufacturing process at 650° C. or lower. However, an at least 700° C. and usually 800° C. or higher temperature condition is required in the melting, reflowing, and annealing step of the BPSG film, and it is impossible to perform melting, reflowing, and annealing because of the above-described demand for controlling the temperature, which brings about a problem that the slit void cannot be removed.

On the other hand, for the HDP-USG film, since a mixed gas of $SiH_4$, $O_2$, and Ar is used as a growth gas in its formation and the melting, reflowing, and annealing step at the high temperature after the film-formation, which is essential for the BPSG film, is not needed, the above-described demand for controlling the temperature is responded. However, there is a problem that it is extremely difficult for the HDP-USG film to respond to the demand for the further finer apparatus, specifically, to secure sufficient filling ability for the semiconductor device in which the aspect ratio of the area between the gate electrodes is 6 or higher.

SUMMARY OF THE INVENTION

The present invention has achieved in consideration of the problems described above, and it is an object of the present invention to provide a semiconductor device capable of, responding to the gate length and the distance between gate electrode structures which have been further shortened recently, securing sufficient ability of filling the area between the gate electrode structures while maintaining excellent device characteristics without requiring a high-temperature process, and a method for manufacturing the same.

The inventor of the present invention has thought of various forms which will be described below as a result of dedicated study.

A method for manufacturing a semiconductor device according to an aspect of the present invention comprises: a step of forming at least one gate electrode structure on a semiconductor substrate with a gate insulating film therebetween so that gate length thereof is 110 nm or shorter; and a step of forming a silicon oxide film containing a conductive impurity at film-formation temperature of 650° C. or lower by a high-density plasma COD method so that difference in a surface level due to the gate electrode structure is lessoned.

A method for manufacturing the semiconductor device according to another aspect of the present invention comprises: a step of forming a plurality of gate electrode structures on a semiconductor substrate with a gate insulating film therebetween so that an aspect ratio of a part between adjacent gate electrode structures is 6 or higher; and a step of forming a silicon oxide film containing a conductive impurity at film-formation temperature of 650° C. or lower by a high-density plasma CVD method in a manner of filling the part between the adjacent gate electrode structures and burying the gate electrode structures.

A semiconductor device according to further another aspect of the present invention comprises: at least one gate electrode structure formed on a semiconductor substrate with a gate insulating film therebetween and having gate length of 110 nm or shorter; and a silicon oxide film containing a conductive impurity formed by a high-density plasma CVD method so that difference in a surface level due to the gate electrode structure is lessened.

A semiconductor device according to still further another aspect of the present invention comprises: a plurality of gate electrode structures formed on a semiconductor substrate with a gate insulating film therebetween so that an aspect ratio of a part between adjacent gate electrode structures is 6 or higher; and a silicon oxide film containing a conductive impurity formed by a high-density plasma CVD method in a manner of filling the part between the adjacent gate electrode structures and burying the gate electrode structures.

BRIEF DESCRIPTION OF THE DRAWINGS

FIG. 2 is a schematic view showing an HDP-CVD apparatus used in the embodiment;

DETAILED DESCRIPTION OF THE PREFERRED EMBODIMENTS

-Essence of the Present Invention-

Figure 1:
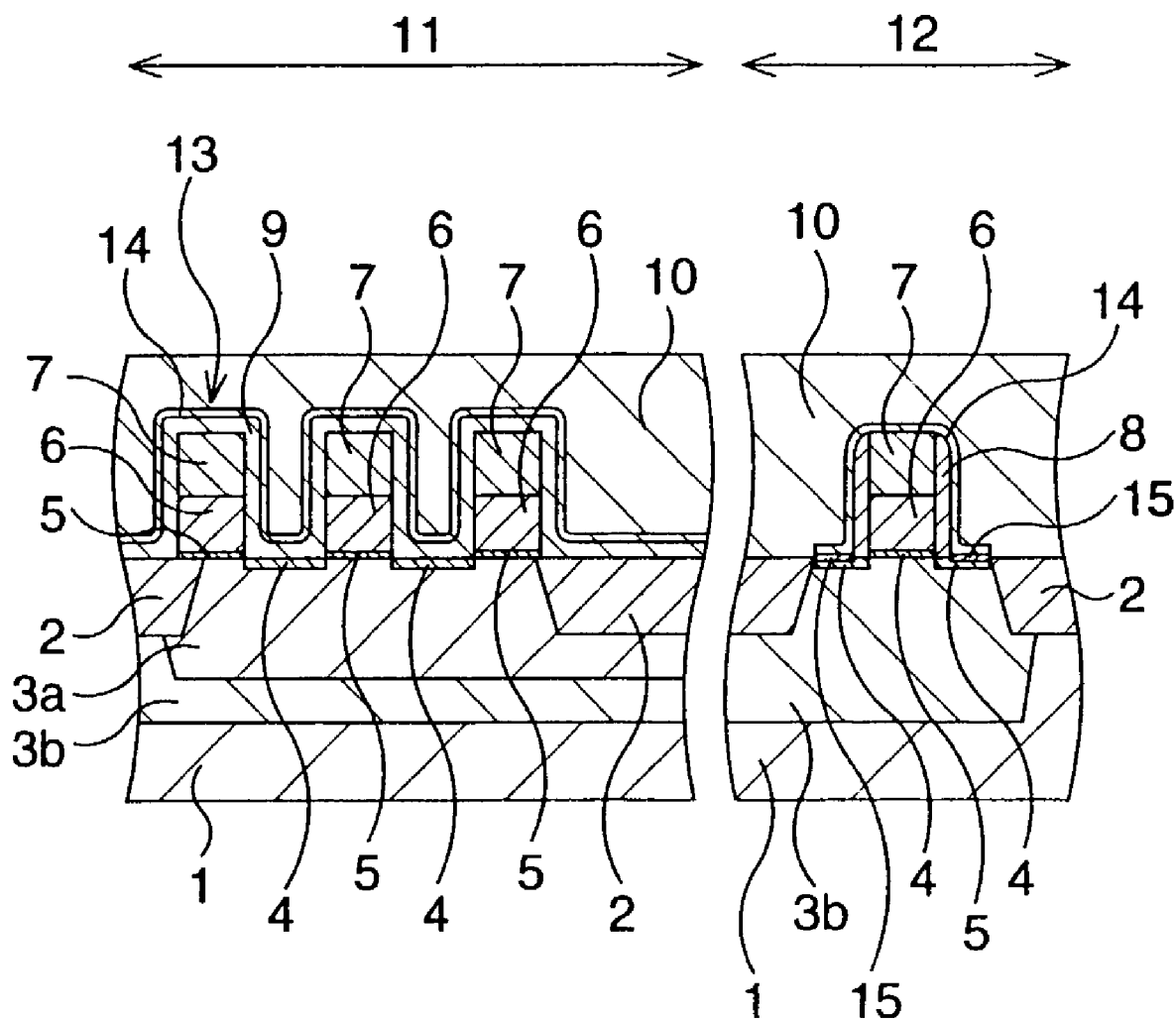
FIG. 1 is a schematic sectional view showing primary components of a DRAM and logic combined type device according to an embodiment.

First of all, the essence of the present invention will be explained. Here, a DRAM and logic combined type device as shown in FIG. 1 for example, will be explained as an example.

In this device, element regions are defined by forming, for example, STI (Shallow Trench Isolation) element isolation structures 2 as element isolation structures on a silicon semiconductor substrate 1 (in the example in the drawing, the left is a memory cell region 11 and the right is a peripheral circuit (logic) region 12), and gate electrode structures 13, each of which is formed to have a source/drain 4 on the semiconductor substrate 1 of both sides thereof, are formed on wells 3a and 3b of the regions 11 and 12.

The gate electrode structure 13 is structured in a manner that a gate electrode 6 and its cap insulating film 7 are pattern-formed on the semiconductor substrate 1 with a gate insulating film 5 therebetween, a silicon nitride film 9 is further formed to cover the gate electrode 6 and the cap insulating film 7 in the memory cell region while side walls 8 are further formed on the sides of the gate electrode 6 and the cap insulating film 7 in the peripheral circuit region 12, and a silicon nitride film 14 as an etching stopper is formed in each of the regions 11 and 12. Moreover, in the peripheral circuit region 12, a Co silicide film 15 for lowering the resistance is formed on the source/drain. In this example, the present invention is mainly directed to a semiconductor device in which a plurality of the gate electrode structures 13 are formed in the memory cell region 11 and the gate length is 110 nm±15 nm or shorter (130 nm or shorter in a design rule) or an aspect ratio of an area between adjacent gate electrode structures 13 (a ratio of the height of the gate electrode structure 13 to the distance between the gate electrode structures 13) is 6 or higher.

In this example, an interlayer insulating film 10 is formed to cover the whole regions 11 and 12 and to fill the area between the adjacent gate electrode structures 13 in the memory cell region 11. Here, the area between the gate electrode structures means a gap between the silicon nitride films 14 of the adjacent gate electrode structures 13 in this example.

In this embodiment, a silicon oxide film containing a conductive impurity, a PSG (HDP-PSG: Phospho Silicate Glass) film in this case, is formed as the interlayer insulating film 10 to bury the gate electrode structures 13 at the film-formation temperature of 650° C. or lower through the use of a high-density plasma CVD (HDP-CVD) method in order to respond to a demand for securing ability of filling the area between the gate electrode structures 13, which is resulted from the further shortened gate length and distance between the gate electrode structures 13, while responding to a demand for controlling the temperature.

Here, further improvement in filling ability becomes possible by using a film-formation gas containing He gas, a mixed gas of $SiH_4/O_2/PH_3$/He for example, in the formation of the interlayer insulating film 10.

In the conventional high-density plasma CVD, a mixed gas containing Ar gas has been used as the film-formation gas and filling ability has been improved with a sputtering effect of Ar by applying bias power. However, it is found that, as the semiconductor devices become finer and the aspect ratio of the gap to be filled becomes higher, the Ar gas shortens a mean free path in the film-formation atmosphere and becomes a factor inhibiting the bottom coverage of the gap. Therefore, by adopting He which is smaller than Ar as a component of the film-formation gas, the factor inhibiting the filling can be eased, which can eventually improve the filling ability.

Further, by using the PSG film, which contains phosphorus as the interlayer insulating film 10, an etching rate of the interlayer insulating film 10 increases, which can contribute to the improvement in workability when a contact hole is formed. Furthermore, in this case, since phosphorus has a gettering effect of mobile ions, metallic contamination which tends to occur in a manufacturing process is prevented by gettering, which can improve the reliability of the device.

EXPERIMENTAL EXAMPLE

Hereinafter various kinds of experiments performed to determine an optimal film-formation condition in forming the HDP-PSG film as the interlayer insulating film will be explained. In the experiments below, an HDP-CVD apparatus as shown in FIG. 2 was used.

This HDP-CVD apparatus has, in a ceramic chamber 101 structured by winding a coil 102, an electrostatic chuck 103 on which a semiconductor substrate 111 is placed and fixed, a supply tube 104 for supplying a growth gas, and a turbo pump 105 for adjusting the inside of the chamber 101 in a desirable vacuum state. A high-frequency power source 106 of, for example, 13.56 MHz and a low-frequency power source 107 of, for example, 400 kHz are provided to the electrostatic chuck 103 and the chamber 101, respectively.

Experimental Example 1

First, as influence of plasma damage due to the usage of the HDP-PSG film as the interlayer insulating film, a threshold voltage $V_{th}$, which is an initial characteristic of a transistor, was studied herein.

Figure 3A:
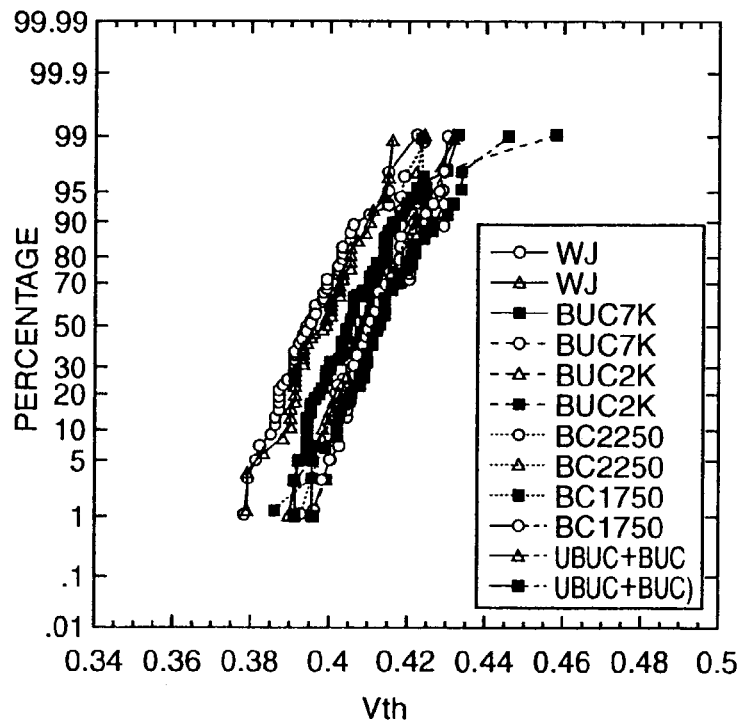
FIGS. 3A and 3B are characteristic charts shown based on comparison of threshold voltage characteristics between a formed HDP-PSG film and a TEOS-$O_3$NSG.
Figure 3B:
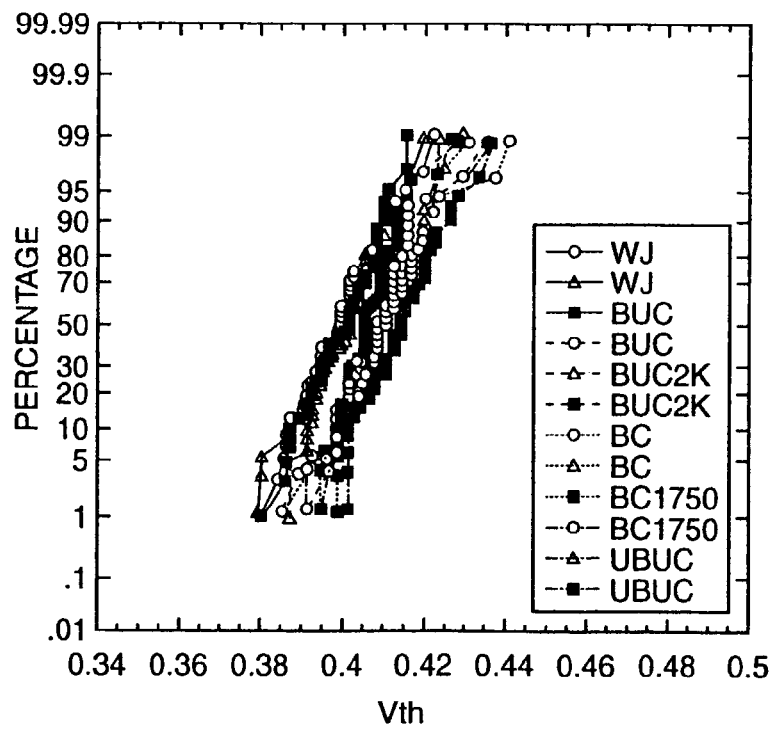

Test results are shown in FIG. 3A and FIG. 3B. Here, FIG. 3A shows a case without an antenna while FIG. 3B shows a case with an antenna ratio of 250. When the HDP-PSG film (shown by BUC: Bias UnClamped in the chart. 7K has film thickness of 700 nm and 2 K has film thickness of 200 nm) formed under a temperature condition of 650° C. and a TEOS-O$_3$NSG (Non-doped-CVD —Silicate glass) film (shown by WJ in the chart) formed without using plasma are compared, threshold voltages V$_{th}$ of both films are similar and influence of plasma damage is not seen.

Subsequently, a Qbd characteristic of the transistor (a breakdown voltage characteristic of a gate insulating film) was studied.

Figure 4:
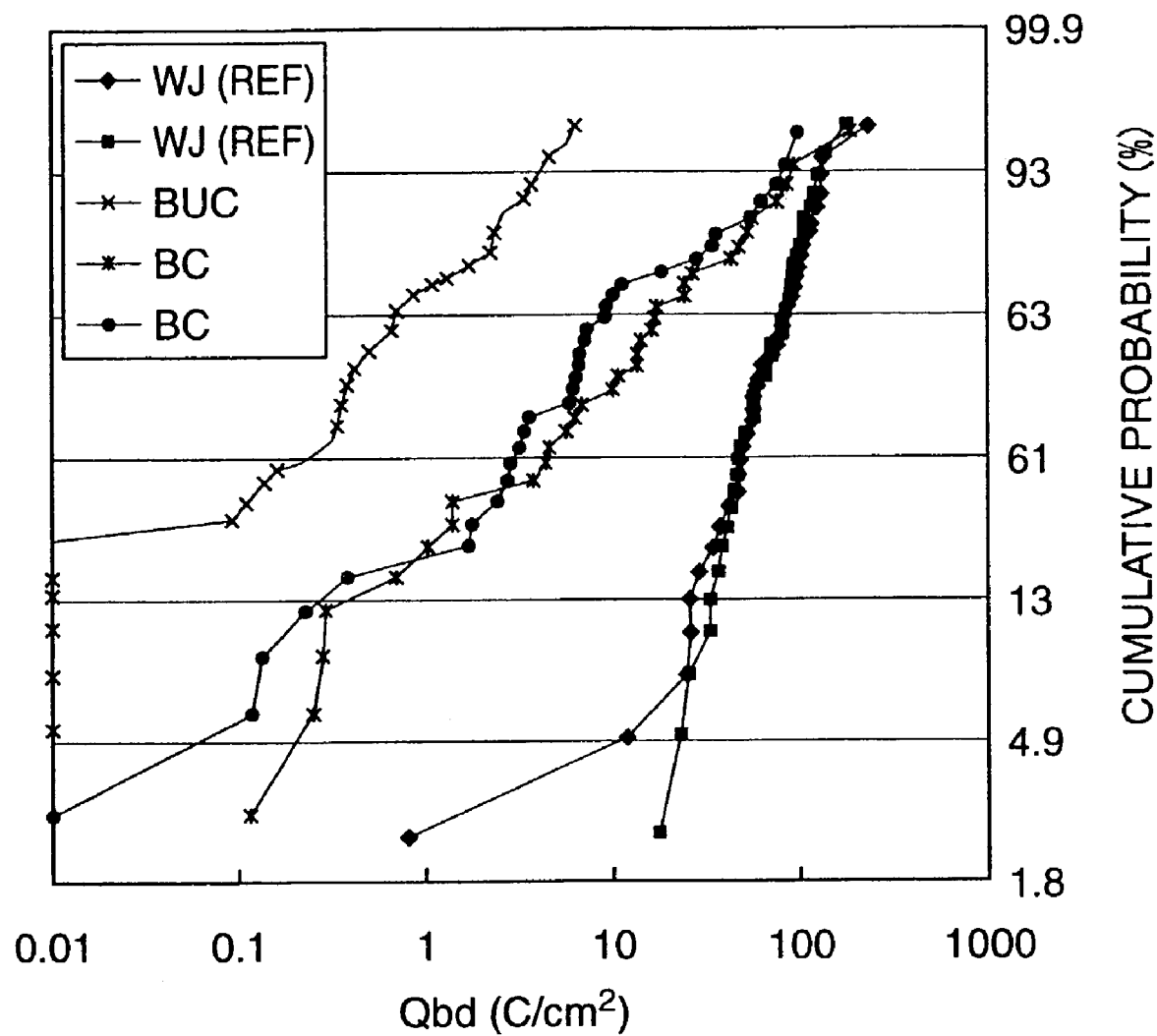
FIG. 4 is a characteristic chart shown based on comparison of Qbd characteristics between the formed HDP-PSG film and the TEOS-$O_3$NSG.

The test results are shown in FIG. 4. Degradation in the Qbd characteristic is seen in the HDP-PSG film (BUC) formed under the temperature condition of 650° C. compared with the TEOS-O$_3$NSG film (WJ), which indicates influence of plasma damage.

The inventor of the present invention has assumed that the degradation in the Qbd characteristic is attributed to the temperature condition in HDP treatment, and has considered that it is necessary to further lower the film-formation temperature to improve the Qbd characteristic. Therefore, as a specific preferable method to lower the film-formation temperature, a BC (Bias Clamped) process was applied, that is, as shown in FIG. 2, the HDP-PSG film was formed by clamping the semiconductor substrate 111 in the electrostatic chuck 103 and cooling it while letting He gas flow toward a rear surface of the substrate by a He supply mechanism 112 which is provided in the electrostatic chuck 103. In this case, the film-formation temperature can be lowered to approximately 450° C.

Even though the HDP-PSG film (shown by BC2250: Bias Clamped; HF2250 W in the chart) formed at approximately 460° C. under the film-formation condition described above has the equal threshold voltage V$_{th}$ to that of the TEOS-O$_3$NSG film (WJ) as shown in FIG. 3A, substantial improvement is seen in its Qbd characteristic compared with the HDP-PSG film (BUC) which has been formed under the temperature condition of 650° C. as shown in FIG. 4.

Figure 5:
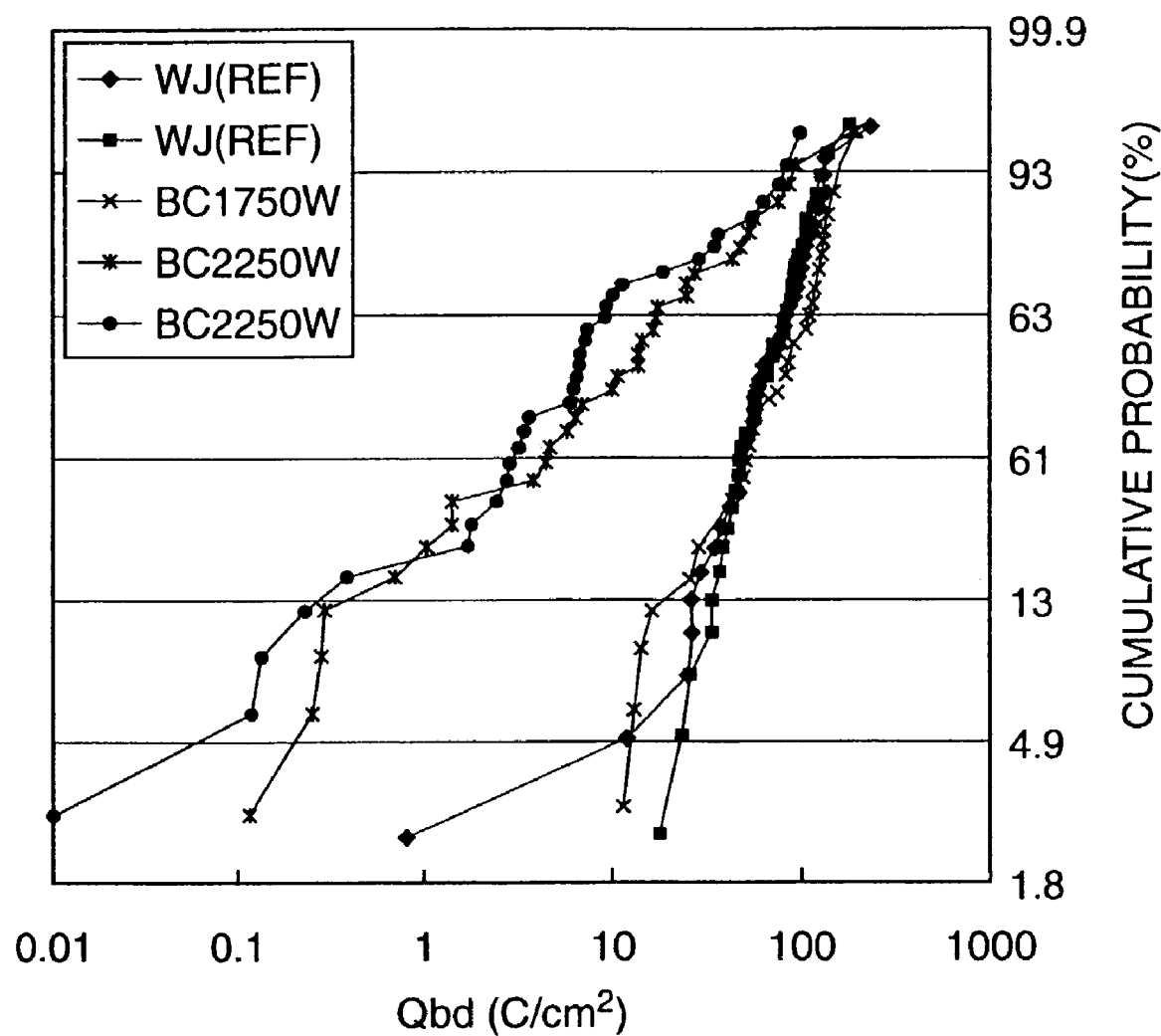
FIG. 5 is a characteristic chart shown based on comparison of the Qbd characteristics between an HDP-PSG film formed by low bias power and the TEOS-$O_3$NSG.

Further, as shown in FIG. 5, by decreasing bias power from 2250 W (BC2250) to 1750 W (BC1750), the Qbd characteristic can be improved to be equal to that of the TEOS-O$_3$NSG film (WJ).

Experimental Example 2

Figure 6A:
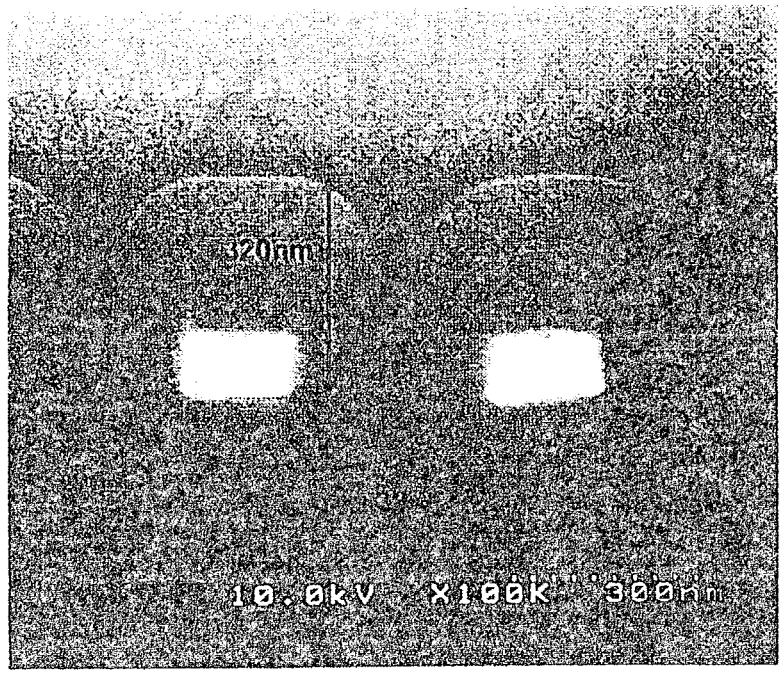
FIGS. 6A and 6B are microscope (SEM) photographs showing filling ability of the formed HDP-PSG films.
Figure 6B:

As described above, it has been confirmed that the Qbd characteristic can be improved by lowering the film-formation temperature through the use of the BC process, but it has been found that slight degradation is seen in filling ability due to the lowering of the film-formation temperature. Specifically, as shown in SEM (Scanning Electron Microscope) photographs in FIG. 6A and FIG. 6B, slightly more slit voids occur in the HDP-PSG film (BC) formed under the temperature condition of 450° C. shown in FIG. 6B compared with the HDP-PSG film (BUC) formed under the temperature condition of 650° C. shown in FIG. 6A.

Figure 7:
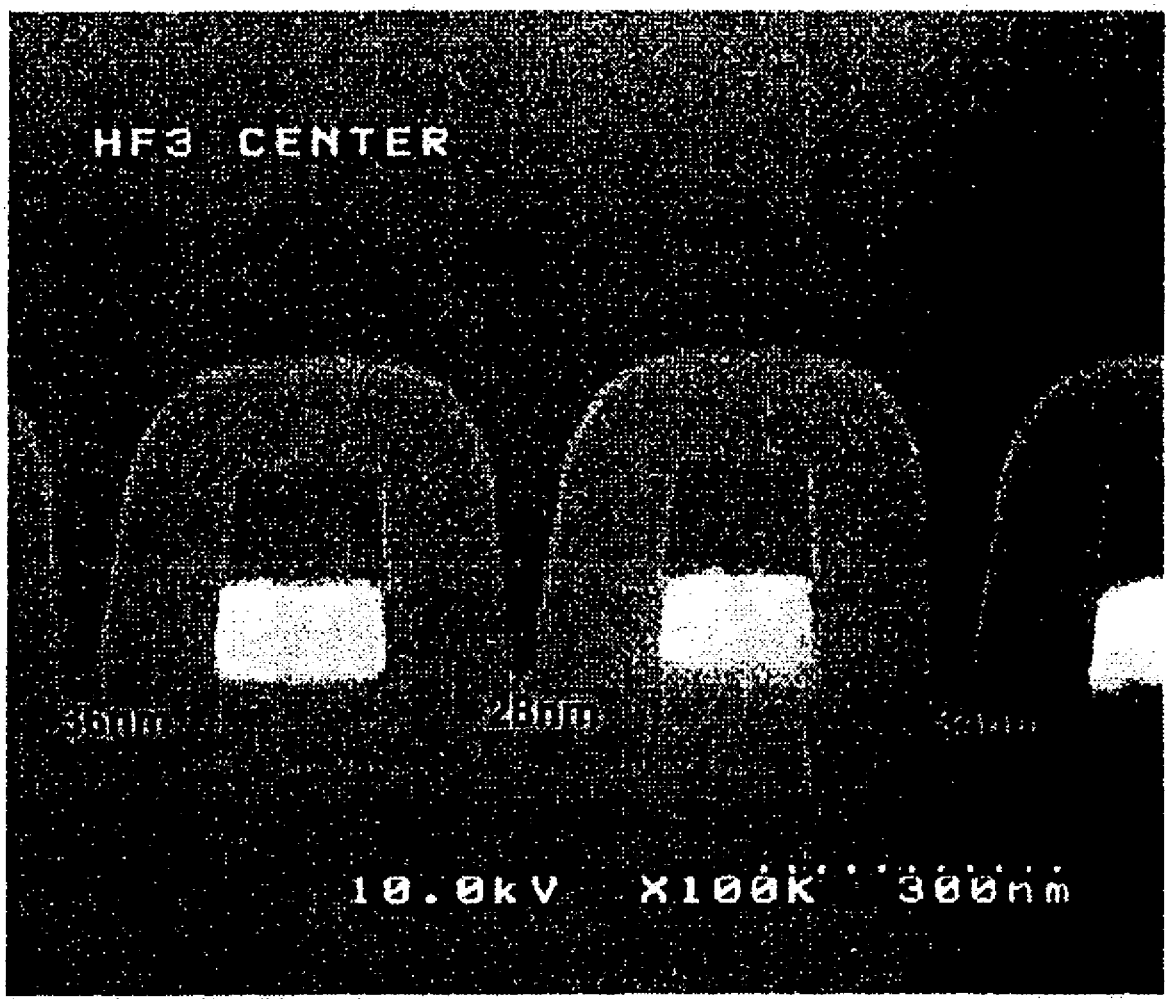
FIG. 7 is a microscope (SEM) photograph showing filling ability of the formed HDP-PSG film.

The inventor of the present invention has intended to increase the mean free path of gas molecules in a film-formation chamber in order to recover filling ability degraded by the lowering of the film-formation temperature, and has thought of lowering pressure in forming the HDP-PSG film. Specifically, when a film-formation pressure was set at approximately 2.7×10$^2$ Pa (2.0 mTorr), although the film-formation pressure had been set at approximately 4.7×10$^2$ Pa (3.5 mTorr) in FIG. 6B, while maintaining other conditions at equal values, it has been found that the slit voids do not occur and high filling ability is obtained as shown in an SEM photograph in FIG. 7. Accordingly, by applying the present invention, it becomes possible to attain excellent filling ability for the semiconductor device whose gate length is 110 nm or shorter (or the aspect ratio of the area between gate electrode structures thereof is 6 or higher) without concern for plasma damage.

-Specific Method for Manufacturing a Semiconductor Device According to an Embodiment of the Present Invention- Hereinafter, the method for manufacturing the DRAM and logic combined type device according to the embodiment will be explained.

FIG. 8A to FIG. 8K are schematic sectional views showing the method for manufacturing the DRAM and logic combined type device according to the embodiment in the order of steps.

Initially, element regions are defined by forming element isolation structures on a semiconductor substrate.

Figure 8A:
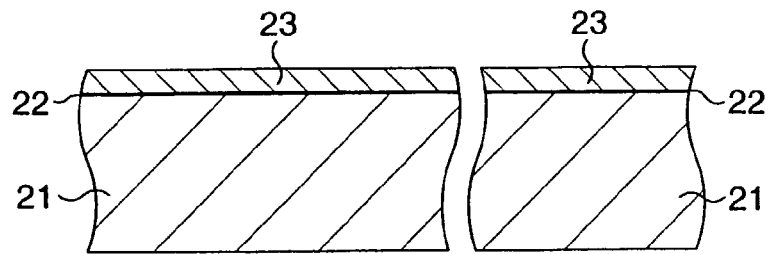
FIGS. 8A to 8K are schematic sectional views showing a method for manufacturing the DRAM and logic combined type device according to the embodiment in the order of steps.

First, as shown in FIG. 8A, a thermal oxide film 22 and a thermal nitride film 23 are sequentially formed on a surface of a silicon semiconductor substrate 21 in film thickness of approximately 5 nm and approximately 100 nm, respectively.

Figure 8B:
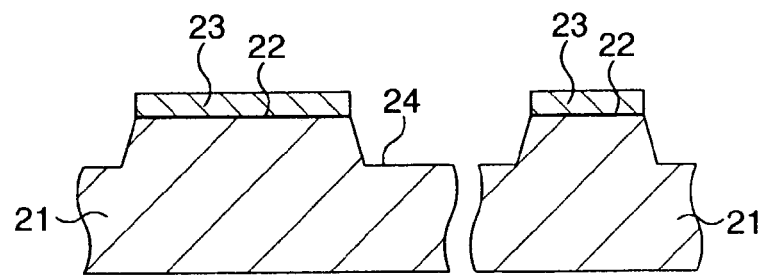

Subsequently, as shown in FIG. 8B, the thermal nitride film 23 is patterned through the use of a photoresist so that only the thermal nitride films 23 in parts to be the element regions remain. Then, after the photoresist is removed by ashing, the thermal oxide film 22 and the semiconductor substrate 21 are etched with the patterned thermal nitride films 23 as hard masks so that trenches 24 having depth of approximately 300 nm are formed in parts to be the element isolation regions of the semiconductor substrate 21.

Figure 8C:
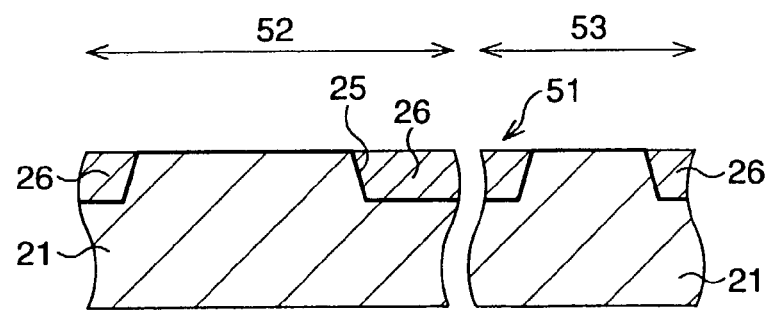

Next, as shown in FIG. 8C, after thermal oxide films 25 are formed in film thickness of approximately 10 nm on inner surfaces of the trenches 24, a silicon oxide film 26 is formed in film thickness of approximately 700 nm by a high-density plasma CVD method so that the trenches 24 are filled. Here, as one example of a film-formation condition of the silicon oxide film 26, a growth gas may be set as SiH$_4$/O$_2$/He=150/300/325 sccm. Thereafter, the HDP silicon oxide film 26 is polished and flattened with the thermal nitride films 23 as stoppers by a CMP (Chemical Mechanical Polishing) method. Then, the thermal nitride films 23 are removed through the use of phosphoric acid.

As described above, STI element isolation structures 51 in which the trenches 24 formed in the element isolating regions of the semiconductor substrate 21 are charged with the HDP silicon oxide films 26 are formed. Here, the left is a memory cell region 52 and the right is a peripheral circuit (logic) region 53 in the drawing.

Figure 8D:
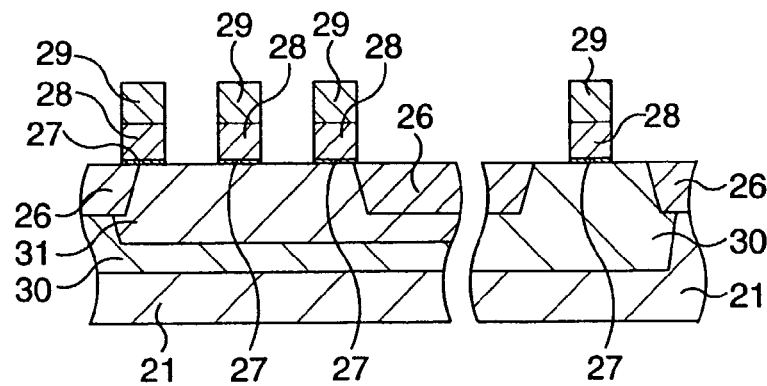

Then, as shown in FIG. 8D, after arsenic (As) is entirely ion-implanted, boron (B) is ion-implanted only in a part to be an n-channel transistor. As a result, an n-well 30 is formed in a part to be a p-channel transistor and a p-well 31 is further formed in the part to be the n-channel transistor.

Subsequently, a gate electrode structure is formed in each of the regions 52 and 53.

First, after a silicon oxide film is formed on the surface of the semiconductor substrate 21 in each of the regions 52 and 53, a polycrystalline silicon film and a silicon nitride film are sequentially formed in film thickness of approximately 160 nm and 150 nm, respectively, by a CVD method. Then, the silicon nitride film, the polycrystalline silicon film, and the silicon oxide film are patterned through the use of a photoresist to form gate electrodes 28 formed on the semiconductor substrate 21 with gate insulating films 27 therebetween and having cap insulating films 29 on upper surfaces thereof. At this time, the gate length of the gate electrode 28 in a design rule is supposed to be 130 nm and the actual gate length is controlled to be approximately 110 nm±15 nm.

Figure 8E:
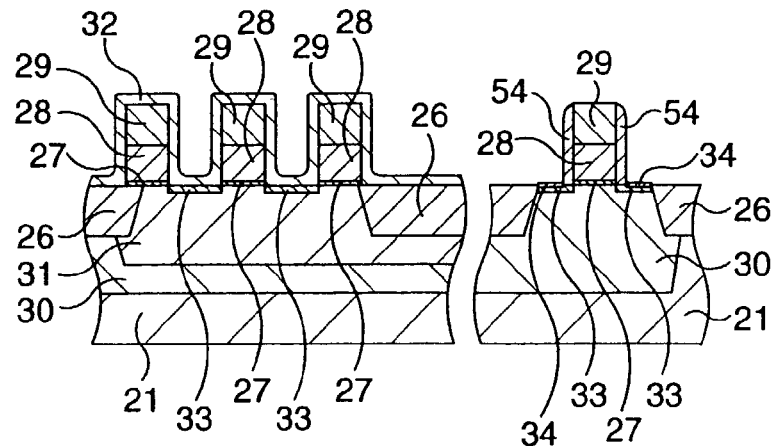

Then, after the photoresist is ashed, as shown in FIG. 8E, a silicon nitride film 32 is entirely formed in film thickness of approximately 60 nm by a thermal CVD method, and the silicon nitride film 32 in the peripheral circuit region 53 is anisotropically etched (etchback) while masking the memory cell region 52 so that sidewalls 54 are formed on the sides of the gate electrode 28 and the cap insulating film 29 in the peripheral circuit region 53.

Next, an impurity is ion-implanted in each of the regions 52 and 53. At this time, the cap insulating films 29 in the memory cell region 52 and the cap insulating film 29 and the sidewalls 54 in the peripheral circuit region 53 work as masks, respectively, and sources/drains 33 are formed on a surface layer of the semiconductor substrate 21 on both sides of the gate electrodes 28. Here, as the impurity, arsenic (As) is used for the part to be the n-channel transistor and boron (B) is used for the part to be the p-channel transistor.

Subsequently, a Co film is formed only in the peripheral circuit region 53 by a sputtering method while masking the memory cell region 52, and is thermally treated in a rapid anneal (RTA: Rapid Thermal Anneal) method so that the source/drain 33 and the Co film are made to react, thereby forming Co silicide films 34 on the source/drain 33. This RTA treatment may be performed in an atmosphere with $N_2$ of 10 (l/min) at 500° C. for 30 seconds.

Figure 8F:
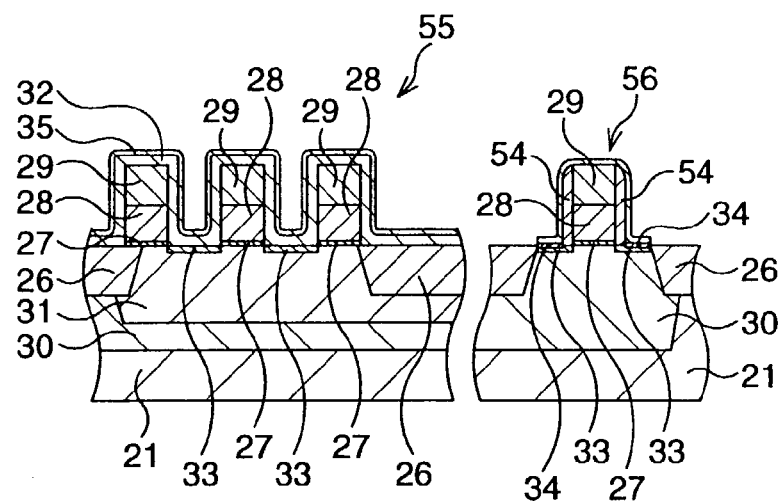

Then, after unreacted Co film is removed, as shown in FIG. 8F, a silicon nitride film 35, which functions as an etching stopper in forming contact holes, which will be described later, is formed all over the regions 52 and 53 in film thickness of approximately 25 nm. In forming the silicon nitride film 35, since the lowering of the film-formation temperature is required in order to secure transistor characteristics in the peripheral circuit region 53, the temperature may be set at 400° C., and a parallel plane plasma CVD apparatus is used with $SiH_4/NH_3$ gas as a growth gas. Further, in order to prevent local overetching due to uniformity of the film thickness, it is essential to secure the film thickness of the silicon nitride film 35 of approximately 25 nm.

In this example, in the memory cell region 52, a structure composed of the gate electrode 28, the cap insulating film 29, and the silicon nitride films 32 and 35 is defined as a gate electrode structure 55. At this time, as one example, the distance between the gate electrode structures 55, that is, the distance between the silicon nitride films 35 in a gap between adjacent gate electrode structures 55, is approximately 50 nm and the height of the gate electrode structure 55 is approximately 300 nm, which causes an aspect ratio of the gap to be approximately 6. On the other hand, in the peripheral circuit region 53, a structure composed of the gate electrode 28, the cap insulating film 29, the sidewalls 54, and the silicon nitride film 35 is defined as a gate electrode structure 56.

Figure 8G:
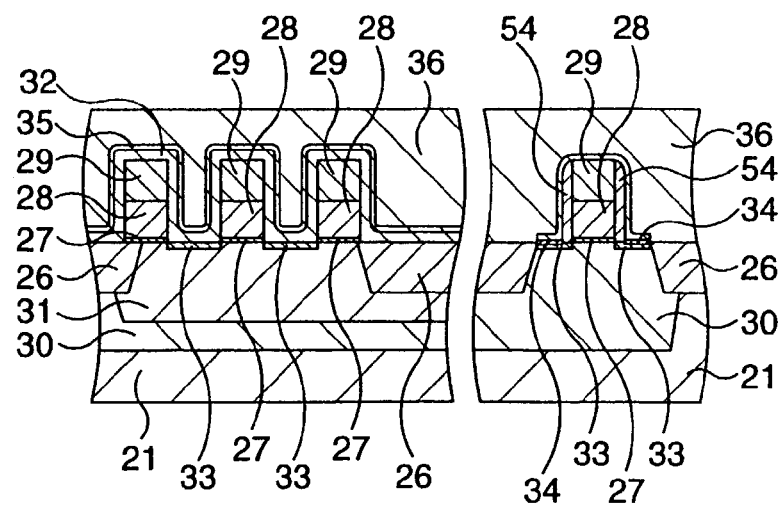

Next, as shown in FIG. 8G, an HDP-PSG film 36 is entirely deposited as an interlayer insulating film in a manner of filling the gap. As one example of a film-formation condition at this time, a growth gas is set as $SiH_4/O_2/PH_3/He=108/235/32/100$ sccm, the LF(400 kHz)/HF(13.56 MHz) are set at 3100/2250 W, phosphorus concentration is set at 5 wt %, the film-formation temperature is set at 600° C. to 650° C., and the film is formed without clamping the semiconductor substrate 21 by the electrostatic chuck. Thereafter, an upper surface of the HDP-PSG film 36 is flattened by the CMP method.

Figure 8H:
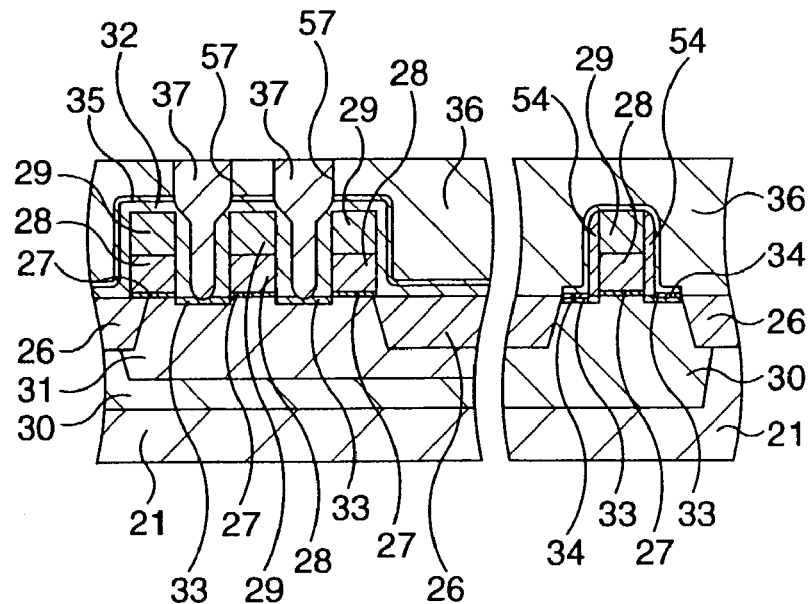

Subsequently, as shown in FIG. 8H, contact holes 57, which expose surfaces of the sources/drains 33 between the gate electrode structures 55, are formed in the HDP-PSG film 36 in the memory cell region 52 by a SAC (Self Align Contact) method. At this time, each of the contact holes 57 is formed in a design rule such that its hole diameter is larger than the distance between the gate electrode structures 55 (gap distance), but it is controlled to the gap distance by the silicon nitride films 35, which work as etching stoppers, and formed to have the hole diameter of the gap distance in a self-aligning manner in the area between the gate electrode structures 55.

Then, a DASI (Doped Amorphous Silicon) film is formed in a manner of filling the contact holes 57, and the DASI film is polished by the CMP method with the HDP-PSG film 36 as a stopper so that DASI plugs 37 in which the contact holes 57 are charged with DASI are formed.

Figure 8I:
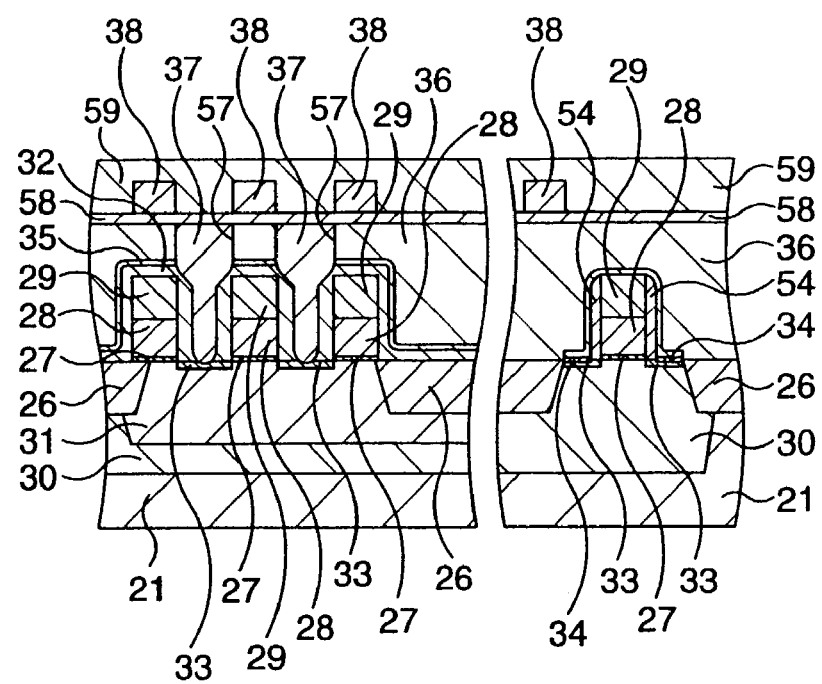

Subsequently, as shown in FIG. 8I, a silicon oxide film 58 is formed on the HDP-PSG film 36 by a plasma CVD method or the thermal CVD method, a glue layer consisting of Ti/TiN is formed by the CVD method, and a tungsten (W) film is formed by the CVD method. Thereafter, the W film is patterned through the use of a photoresist to form bit lines 38. Then, a USG film 59 is formed in a manner of burying the bit lines 38 by the HDP-CVD method, and its upper surface is flattened by the CMP method or the like.

Next, memory capacitors are formed in the memory cell region 52.

Figure 8J:
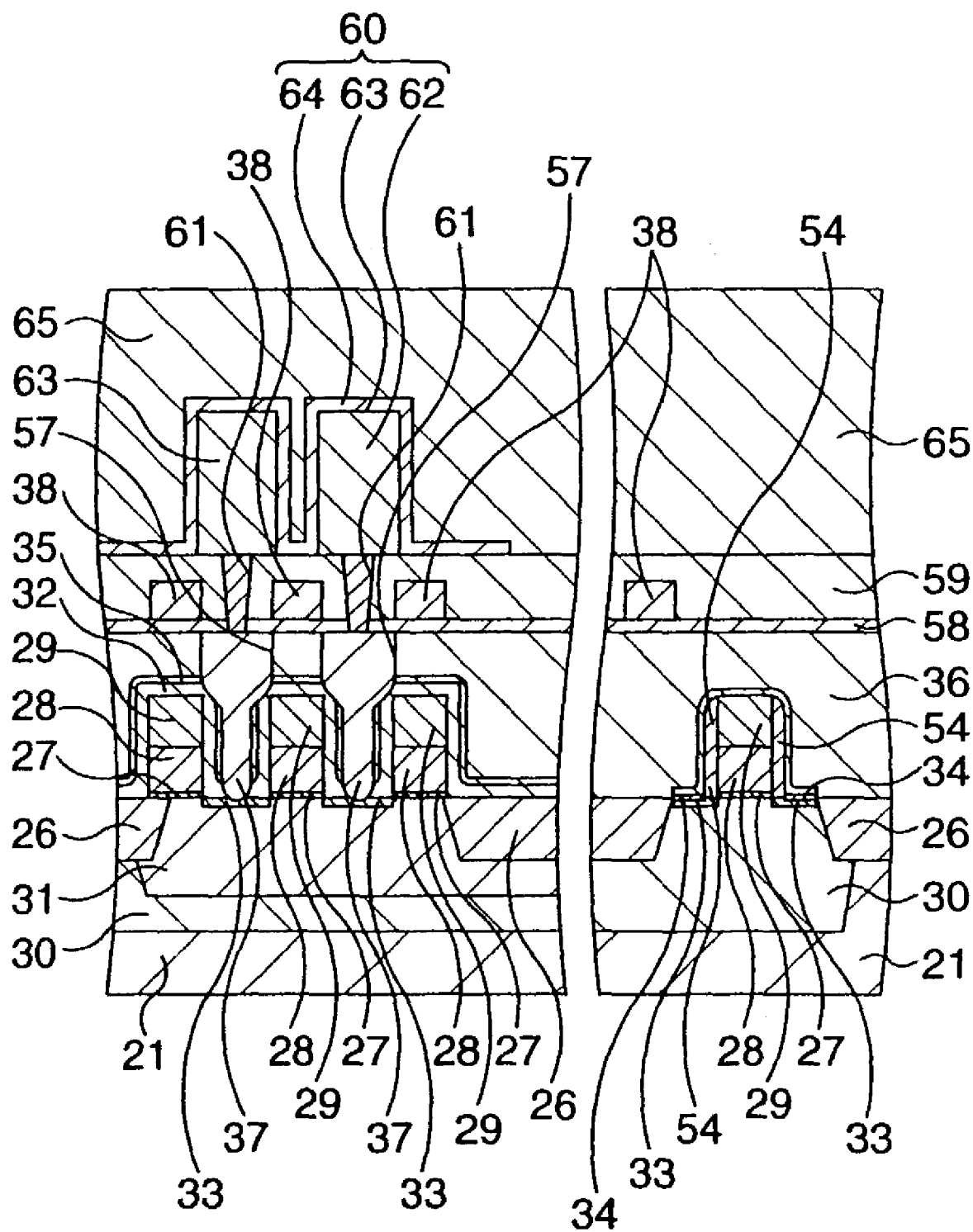

Specifically, as shown in FIG. 8J, via holes 61 which communicate with the DASI plugs 37 are formed in the USG film 59 and the silicon oxide film 58, a DASI film is formed on the USG film 59 in a manner of filling the via holes 61, and the DASI film is patterned so that storage node electrodes 62 are formed. Thereafter, a dielectric film 63 and a DASI film are sequentially formed to cover the storage node electrodes 62, and the DASI film and the dielectric film 63 are patterned so that a cell plate electrode 64 covering the storage node electrodes 62 via the dielectric film 63 is formed. At this time, memory capacitors 60 in which the storage node electrodes 62 and the cell plate electrode 64 are capacitively coupled via the dielectric film 63 are formed. Then, a USG film 65 is formed to cover the memory capacitors 60 by the HDP-CVD method, and its surface is flattened by the CMP method or the like.

Figure 8K:
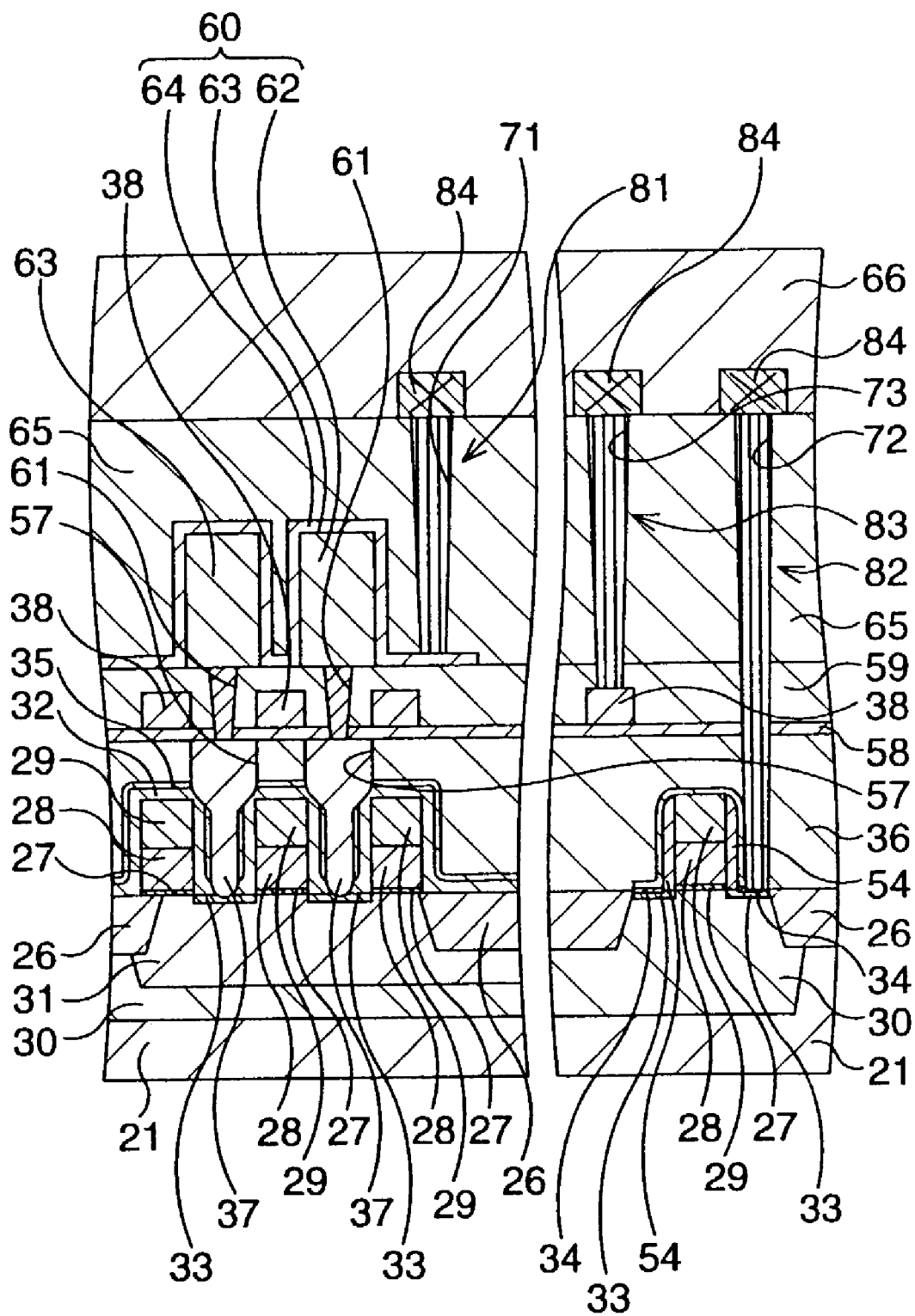

Subsequently, as shown in FIG. 8K, plural kinds, three kinds in an example of the drawing, of contact holes (via holes) are formed.

Specifically, first of all, a via hole 71 which exposes a surface of the cell plate electrode 64 and a contact hole 72 which exposes a surface of the Co silicide film 34 are simultaneously formed. The via hole 71 is formed in the USG film 65. The contact hole 72 is formed in the USG film 65, the USG film 59, the silicon oxide film 58, and the HDP-PSG film 36. At this time, following two stages of an etching process are performed. In the first stage, etching may be performed at 20° C. for 30 seconds using $C_4H_8/Ar/O_2$ gas=10/200/20 sccm as a growth gas. As a result, the via hole 71 is formed and the contact hole 72 is opened up to the silicon oxide film 58. In the subsequent second stage, etching may be performed at 20° C. for 130 seconds using $C_4H_8/CH_2F_2/Ar/O_2$ gas=7/5/700/3 sccm as a growth gas. As a result, the HDP-PSG film 36 is etched so that the contact hole 72 is formed. On the other hand, for the via hole 71, the cell plate electrode 64 works as an etching stopper.

Next, a via hole 73 which exposes a surface of the bit line 38 is formed in the USG films 65 and 59.

Then, a W film is formed by the CVD method or the like in a manner of filling the via holes 71 and 73 and the contact hole 72, and a surface of the W film is polished by the CMP method so that W plugs 81, 83, and 82 in which the via holes 71 and 73 and the contact hole 72 are buried with W are formed.

Thereafter, a glue layer consisting of Ti/TiN is formed on the USG film 65 by the CVD method, an aluminum (Al) film is formed by the sputtering method, the Al film is patterned to form Al wirings 84 which are connected with the W plugs 81, 82, and 83 respectively, and a USG film 66 is formed by the plasma CVD method in a manner of burying the Al wirings 84. Thus, the DRAM and logic combined type device is completed.

As explained above, according to the DRAM and logic combined type device of the embodiment, it becomes possible to secure sufficient ability of filling the area between the gate electrodes responding to the recent further shortened gate length and distance between the gate electrodes while maintaining excellent device characteristics without requiring a high-temperature process.

Incidentally, the present invention is not limited to the above-described embodiment but preferably applied to a logic device or other various semiconductor devices requiring finer gate electrodes, other than the DRAM and logic combined type device.

It becomes possible to secure sufficient ability of filling the area between the gate electrode structures responding to the recent further shortened gate length and distance between the gate electrode structures while maintaining excellent device characteristics without requiring a high-temperature process.

What is claimed is:

1. A method for manufacturing a semiconductor device comprising the steps of:
    forming at least one gate electrode structure on a semiconductor substrate with a gate insulating film therebetween so that gate length thereof is 110 nm or shorter;
    forming a sidewall on the side surface of said gate electrode structure;
    after forming said side wall forming a silicon oxide film containing a conductive impurity and covering said gate electrode structure as an interlayer insulating film at film-formation temperature of 650° C. or lower by a high-density plasma CVD method using a film-formation gas containing He so that difference in a surface level due to said gate electrode structure is lessened;
    forming holes in said interlayer insulating film, with said gate electrode structure being covered with said interlayer insulating film; and
    forming conductive plugs in said holes.

2. The method for manufacturing the semiconductor device according to claim 1, wherein, in forming said gate electrode structure, a design rule of said gate length is set at 130 nm or shorter.

3. The method for manufacturing the semiconductor device according to claim 1, wherein said silicon oxide film is a PSG film.

4. The method for manufacturing the semiconductor device according to claim 2, wherein said silicon oxide film is a PSG film.

5. The method for manufacturing the semiconductor device according to claim 1, wherein said gate electrode structure is formed in a manner in which a pattern-formed gate electrode is covered with an insulating film, and silicon oxide film is formed in a manner of burying said gate electrode structure.

6. The method for manufacturing the semiconductor device according to claim 2, wherein said gate electrode structure is formed in a manner in which a pattern-formed gate electrode is covered with an insulating film, and said silicon oxide film is formed in a manner of burying said gate electrode structure.

7. The method for manufacturing the semiconductor device according to claim 3, wherein said gate electrode structure is formed in a manner in which a pattern-formed gate electrode is covered with an insulating film, and said silicon oxide film is formed in a manner of burying said gate electrode structure.

8. The method for manufacturing the semiconductor device according to claim 4, wherein said gate electrode structure is formed in a manner in which a pattern-formed gate electrode is covered with an insulating film, and said silicon oxide film is formed in a manner of burying said gate electrode structure.

9. The method for manufacturing the semiconductor device according to claim 1, wherein an aspect ratio of an area between adjacent gate electrode structures is 6 or higher.

10. The method for manufacturing the semiconductor device according to claim 2, wherein an aspect ratio of an area between adjacent gate electrode structures is 6 or higher.

11. The method for manufacturing the semiconductor device according to claim 3, wherein an aspect ratio of an area between adjacent gate electrode structures is 6 or higher.

12. The method for manufacturing the semiconductor device according to claim 4, wherein an aspect ratio of an area between adjacent gate electrode structures is 6 or higher.

13. The method for manufacturing the semiconductor device according to claim 5, wherein an aspect ratio of an area between adjacent gate electrode structures is 6 or higher.

14. The method for manufacturing the semiconductor device according to claim 6, wherein an aspect ratio of an area between adjacent gate electrode structures is 6 or higher.

15. The method for manufacturing the semiconductor device according to claim 7, wherein an aspect ratio of an area between adjacent gate electrode structures is 6 or higher.

16. The method for manufacturing the semiconductor device according to claim 8, wherein an aspect ratio of an area between adjacent gate electrode structures is 6 or higher.

17. The method for manufacturing the semiconductor device according to claim 1, wherein, in forming said silicon oxide film, a growth gas containing He gas is used.

18. The method for manufacturing the semiconductor device according to claim 2, wherein, in forming said silicon oxide film, a growth gas containing He gas is used.

19. The method for manufacturing the semiconductor device according to claim 3, wherein, in forming said silicon oxide film, a growth gas containing He gas is used.

20. The method for manufacturing the semiconductor device according to claim 4, wherein, in forming said silicon oxide film, a growth gas containing He gas is used.

21. The method for manufacturing the semiconductor device according to claim 5, wherein, in forming said silicon oxide film, a growth gas containing He gas is used.

22. The method for manufacturing the semiconductor device according to claim 6, wherein, in forming said silicon oxide film, a growth gas containing He gas is used.

23. The method for manufacturing the semiconductor device according to claim 7, wherein, in forming said silicon oxide film, a growth gas containing He gas is used.

24. The method for manufacturing the semiconductor device according to claim 8, wherein, in forming said silicon oxide film, a growth gas containing He gas is used.

25. The method for manufacturing the semiconductor device according to claim 9, wherein, in forming said silicon oxide film, a growth gas containing He gas is used.

26. The method for manufacturing the semiconductor device according to claim 10, wherein, in forming said silicon oxide film, a growth gas containing He gas is used.

27. The method for manufacturing the semiconductor device according to claim 11, wherein, in forming said silicon oxide film, a growth gas containing He gas is used.

28. The method for manufacturing the semiconductor device according to claim 12, wherein, in forming said silicon oxide film, a growth gas containing He gas is used.

29. The method for manufacturing the semiconductor device according to claim 13, wherein, in forming said silicon oxide film, a growth gas containing He gas is used.

30. The method for manufacturing the semiconductor device according to claim 14, wherein, in forming said silicon oxide film, a growth gas containing He gas is used.

31. The method for manufacturing the semiconductor device according to claim 15, wherein, in forming said silicon oxide film, a growth gas containing He gas is used.

32. The method for manufacturing the semiconductor device according to claim 16, wherein, in forming said silicon oxide film, a growth gas containing He gas is used.

33. The method for manufacturing the semiconductor device according to claim 1, wherein, the step of forming said silicon oxide film comprises the step of letting He gas low toward a rear face of said semiconductor substrate, thereby controlling said film-formation temperature.

34. The method for manufacturing the semiconductor device according to claim 1, wherein, in forming said silicon oxide film, film-formation pressure is set at 0.47 Pa or lower.

35. The method for manufacturing the semiconductor device according to claim 1, wherein, said conductive plug comprises tungsten.

* * * * *